United States Patent [19]

Capasso et al.

[11] Patent Number: 4,902,912
[45] Date of Patent: Feb. 20, 1990

[54] APPARATUS INCLUDING RESONANT-TUNNELING DEVICE HAVING MULTIPLE-PEAK CURRENT-VOLTAGE CHARACTERISTICS

[75] Inventors: Federico Capasso, Westfield; Alfred Y. Cho, Summit; Susanta Sen, Scotch Plains; Masakazu Shoji; Deborah Sivco, both of Warren, all of N.J.

[73] Assignee: American Telephone and Telegraph Company, AT&T Bell Laboratories, Murray Hill, N.J.

[21] Appl. No.: 366,340

[22] Filed: Jun. 13, 1989

Related U.S. Application Data

[63] Continuation of Ser. No. 68,974, Jul. 1, 1987, abandoned.

[51] Int. Cl.⁴ ..................... H01L 29/205; H01L 29/88
[52] U.S. Cl. .......................................... 307/322; 357/4; 357/12; 357/16
[58] Field of Search ................ 357/4, 12, 16; 307/322

[56] References Cited

U.S. PATENT DOCUMENTS 3,053,998  9/1962  Chynoweth et al. ................. 357/12
4,581,621  4/1986  Reed ..................................... 357/16

OTHER PUBLICATIONS

"Resonant Tunneling Through Double Barrier Perpendicular Quantum Transport Phenomena in Supperlattices, and Their Device Application", *IEEE Journal of Quantum Electronics*, vol. QE-22, 1986, pp. 1853-1869, by F. Capasso et al.

"Millimeter-Band Oscillations Based on Resonant Tunneling in a Double-Barrier Diode at Room Temperature", *Applied Physics Letters*, vol. 50, 1987, pp. 83-85, by E. R. Brown et al.

"New Resonant Tunneling Diode With a Deep Quantum Well", *Japanese Journal of Applied Physics*, vol. 25, 1986, pp. L786-L788, by H. Toyoshima et al.

"Observation of a Negative Differential Resistance Due to Tunneling Through a Single Barrier into a Quantum Well", *Applied Physics Letters*, vol. 49, 1986, pp. 70-72, by H. Morkoc et al..

"Resonant Tunneling Transistor With Quantum Well Base and High-Energy Injection: A New Negative Differential Resistance Device", *Journal of Applied Physics*, vol. 58, 1985, pp. 1366-1368, by F. Capasso et al.

"A New Functional, Resonant-Tunneling Hot Electron Transistor (RHET)", *Japanese Journal of Applied Physics*, vol. 24, 1985, pp. L853-L854, by N. Yokoyama et al.

"Quantum-Well Resonant Tunneling Bipolar Transistor Operating at Room Temperature", *IEEE Electron Device Letters*, vol. EDL-7, 1986, pp. 573-575, by F. Capasso et al.

"A Resonant-Tunneling Bipolar Transistor (RBT): A Proposal and Demonstration for New Functional Devices With High Current Gains", *Technical Digest of the 1986 International Electron Devices Meeting*, pp. 286-289, by T. Futatsugi et al.

"Tunneling Transfer Field-Effect Transistor: A Negative Transconductance Device", *Applied Physics Letters*, vol. 50, 1987, pp. 410-412, by B. Vinter et al.

"Inverted Base-Collector Tunnel Transistors", *Applied Physics Letters*, vol. 47, 1985, pp. 888-890, by A. R. Bonnefoi et al.

(List continued on next page.)

*Primary Examiner*—William D. Larkins
*Attorney, Agent, or Firm*—Peter A. Businger

[57] ABSTRACT

A semiconductor integrated resonant-tunneling device having multiple negative-resistance regions, and having essentially equal current peaks in such regions, is useful as a highly compact element, e.g., in apparatus designed for ternary logic operations, frequency multiplication, waveform scrambling, memory operation, parity-bit generation, and coaxial-line driving. The device can be made by layer deposition on a substrate and includes a resonant-tunneling structure between contacts such that side-by-side first and third contacts are on one side, and a second contact is on the opposite side of the resonant-tunneling structure.

20 Claims, 8 Drawing Sheets

OTHER PUBLICATIONS

"Resonant Tunneling of Two-Dimensional Electrons Through a Quantum Wire: A Negative Transconductance Device", *Applied Physics Letters,* vol. 47, 1985, pp. 1347–1693, by S. Luryi et al.

"Charge Injection Transistor Based on Real-Space Hot-Electron Transfer", *IEEE Transactions on Electron Devices,* vol. ED-31, 1984, pp. 832–839, by S. Luryi et al.

"An All-CMOS Ternary Identity Cell for VLSI Implementation", *Electronics Letters,* vol. 20, 1984, pp. 221–222, by A. Hueng et al.

"Experimental Realization of a Resonant Tunneling Transistor", *Applied Physics Letters,* vol. 50, 1987, pp. 451–453, by T. K. Woodward et al.

APPARATUS INCLUDING RESONANT-TUNNELING DEVICE HAVING MULTIPLE-PEAK CURRENT-VOLTAGE CHARACTERISTICS

This application is a continuation of application Ser. No. 068,974, filed on July 1, 1987, now abandoned.

TECHNICAL FIELD

The invention is concerned with apparatus including semiconductor devices whose operation is based on resonant tunneling through a quantum well.

BACKGROUND OF THE INVENTION

Concomitant to a continuing trend towards miniaturization and increased functional density in electronic devices, considerable attention has been paid to so-called resonant-tunneling devices as characterized by operation involving carrier energy coinciding with a quantized energy level in a potential well. After early theoretical work, resonant-tunneling devices have been implemented at least experimentally, and an extensive literature has come into existence concerning theoretical and practical device aspects as surveyed, e.g., by F. Capasso et al., "Resonant Tunneling Through Double Barriers, Perpendicular Quantum Transport Phenomena in Superlattices, and Their Device Applications", *IEEE Journal of Quantum Electronics*, Vol. QE-22 (1986), pp. 1853–1869.

Resonant-tunneling devices can be made as diodes and as transistors; see, e.g.,

E. R. Brown et al., "Millimeter-band Oscillations Based on Resonant Tunneling in a Double-barrier Diode at Room Temperature", *Applied Physics Letters*, Vol. 50 (1987), pp. 83–85;

H. Toyoshima et al., "New Resonant Tunneling Diode with a Deep Quantum Well", *Japanese Journal of Applied Physics*, Vol. 25 (1986), pp. L786–L788;

H. Morkoc et al., "Observation of a Negative Differential Resistance Due to Tunneling through a Single Barrier into a Quantum Well", *Applied Physics Letters*, Vol 49 (1986), pp. 70–72;

F. Capasso et al., "Resonant Tunneling Transistor with Quantum Well Base and High-energy Injection: A New Negative Differential Resistance Device", *Journal of Applied Physics*, Vol. 58 (1985), pp. 1366–1368;

N. Yokoyama et al., "A New Functional, Resonant-Tunneling Hot Electron Transistor (RHET)", *Japanese Journal of Applied Physics*, Vol. 24 (1985), pp. L853–L854;

F. Capasso et al., "Quantum-well Resonant Tunneling Bipolar Transistor Operating at Room Temperature", *IEEE Electron Device Letters*, Vol. EDL-7 (1986), pp. 573–575;

T. Futatsugi et al., "A Resonant-tunneling Bipolar Transistor (RBT): A Proposal and Demonstration for New Functional Devices with High Current Gains", *Technical Digest of the* 1986 *International Electron Devices Meeting*, pp. 286–289;

T. K. Woodward et al., "Experimental Realization of a Resonant Tunneling Transistor", *Applied Physics Letters*, Vol. 50 (1987), pp. 451–453;

B. Vinter et al., "Tunneling Transfer Field-effect Transistor: A Negative Transconductance Device", *Applied Physics Letters*, Vol. 50 (1987), pp. 410–412;

A. R. Bonnefoi et al., "Inverted Base-collector Tunnel Transistors", *Applied Physics Letters*, Vol. 47 (1985), pp. 888–890;

S. Luryi et al., "Resonant Tunneling of Two-dimensional Electrons through a Quantum Wire: A Negative Transconductance Device", *Applied Physics Letters*, Vol. 47 (1985), pp. 1347–1693; and S. Luryi et al., "Charge Injection Transistor Based on Real-Space Hot-Electron Transfer", *IEEE Transactions on Electron Devices*, Vol. ED-31 (1984), pp. 832–839.

Considered as of particular interest are devices having currentvoltage characteristics including multiple negative resistance regions—this on account of potentially greatly reduced circuit complexity attendant to the use of such devices. However, while such multiple regions can be obtained from a plurality of resonances of a quantum well, resulting devices typically suffer from the drawback that current peaks corresponding to excited states carry significantly greater amounts of current as compared with the amount of current carried in the ground state.

SUMMARY OF THE INVENTION

Apparatus in accordance with the invention such as, e.g., central processors and memory, switching systems, frequency multipliers, and waveform scramblers include a device which, under suitable operating conditions, has a plurality of negative resistance regions with equal or nearly equal peak currents, separation between the peaks being voltage tunable. Device operation is based on exclusive use of the ground-state resonance of a quantum well. The device includes a substrate-supported resonant-tunneling structure between terminals such that side-by-side first and third terminals are on one side, and a second terminal is on the opposite side of the resonant-tunneling structure.

DETAILED DESCRIPTION

Figure 1:
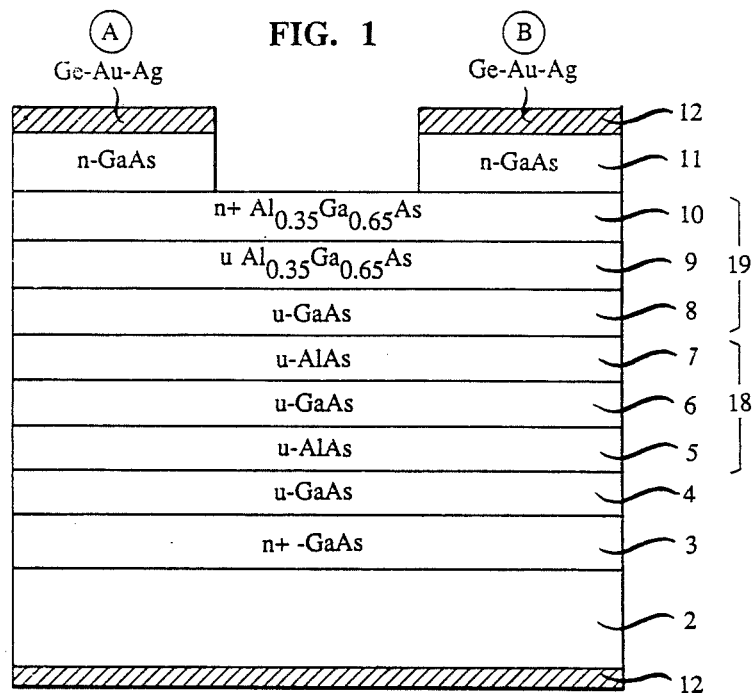
FIG. 1 is a schematic cross-sectional representation of a preferred embodiment of a device in apparatus of the invention.

Representation device structure as shown in FIG. 1 may be made by standard molecular-beam-epitaxy processing starting with gallium arsenide substrate 2 whose crystallographic orientation is (100), and which is doped n+ with silicon. Epitaxially deposited on substrate 2 is a gallium arsenide buffer layer 3 which is doped n+ with approximately $5 \times 10^{17}/cm^3$ silicon, and which has a thickness of approximately 1 micrometer. Further deposited are a nominally undoped gallium arsenide layer 4 having a thickness of approximately 250 nanometers, followed by layers 5, 6, and 7 which form a resonant-tunneling double barrier 18 including a quantum well. Barrier layers 5 and 7 are nominally undoped aluminum arsenide layers having a thickness of approximately 2 nanometers, and quantum-well layer 6 is a nominally undoped gallium arsenide layer having a thickness of approximately 7 nanometers. (Barrier and quantum well layers may have homogeneous or heterogeneous composition as, e.g., in the case of linearly graded barrier layers or a parabolically graded well layer. Typically, the bandgap of the material of the quantum-well layer is less than the bandgap of the material of the barrier layers.)

On the double-barrier structure 18, a heterojunction 19 is grown, preferably in the form of a modulation-doped aluminum gallium arsenide/gallium arsenide heterojunction consisting of a nominally undoped gallium arsenide channel layer 8 having a thickness of approximately 20 nanometers, a nominally undoped $Al_{0.35}Ga_{0.65}As$ spacer layer 9 having a thickness of approximately 8 nanometers, and an $Al_{0.35}Ga_{0.65}As$ donor layer 10, doped n+ with approximately $2 \times 10^{18}/cm^3$ silicon, and having a thickness of approximately 40 nanometers. Channel layer 8 contains a high-mobility electron gas which has a density of approximately $10^{18}/cm^3$, and which is spatially separated by spacer layer 9 from the parent donors in the aluminum gallium arsenide donor layer 10.

Use of a modulation-doped heterojunction 19 as described above is in the interest of facilitating the formation of low-resistance ohmic contact to the heterojunction while keeping the dopants away from the double barrier. Also, the aluminum gallium arsenide of layer 9 serves to passivate the adjacent gallium arsenide channel layer 8.

After deposition of gallium arsenide contact layer 11, doped n+ with approximately $2 \times 10^{17}/cm^3$ silicon and having a thickness of approximately 140 nanometers, metallization layer 12 is formed by evaporation, on layer 11 in the presence of a lift-off mask, and also on substrate 2. Conveniently, germanium (12 nanometers), gold (27 nanometers), silver (100 nanometers), and gold (150 nanometers) are evaporated in succession, and two contact pads A and B are made approximately 240 micrometers long and 80 micrometers wide, situated side-by-side, with long sides adjacent and separated by a distance of approximately 6.5 micrometers. Heat treatment for 10 seconds at a temperature of 380 degrees C. is suitable for alloying of the metallization, and the alloyed metallization can further serve as a mask for wet chemical etching of layer 11 to expose layer 10, e.g., by means of a selective stop etch of hydrogen peroxide and ammonium hydroxide, with pH approximately 7.2.

While molecular-beam epitaxy is considered as well-suited and convenient for device fabrication, the use of other deposition methods is not precluded. For example, sufficient accuracy in layer composition and thickness may be achievable in liquid-phase epitaxy (LPE) and in atomic-layer epitaxy (ALE). Also, while the material system GaAs/AlAs is convenient for device implementation, other material combinations can be used as selected, e.g., from the systems InGaAs/InAlAs, InGaAsP/InP, and GaAs/AlGaAs, lattice-matched to suitable gallium-arsenide or indium-phosphide substrates.

Figure 2:
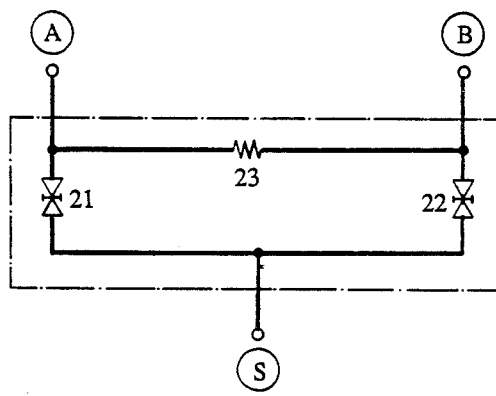
FIG. 2 is a diagram of a circuit which is operationally equivalent to the device shown in FIG. 1.

With reference to FIG. 2, a device as shown in FIG. 1 can be understood in functional terms as being equivalent to two resonant-tunneling diodes 21 and 22 in parallel, with resistor 23 connecting the diodes as corresponding to the portion of channel layer 8 extending the length of the gap between contact pads A and B of FIG. 1. (In the device as specifically described above, the resistance of this portion as measured between contacts A and B was fond to be approximately 12 ohms.) Terminals A and B, as well as substrate terminal S shown in FIG. 2 are in correspondence with contact pads of FIG. 1.

Figure 3:
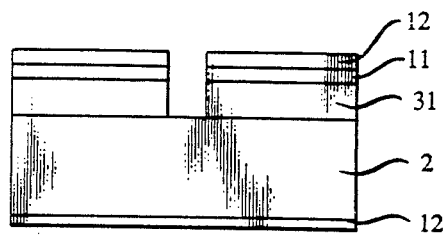
FIG. 3 is a schematic cross-sectional representation of a second preferred embodiment of a device in apparatus of the invention.

During device operation, resonant tunneling current flows from the substrate through the double barrier into the channel layer, and such current flows under the contact pads as well as in the region between the pads. Preferably, pads A and B have approximately the same area and, for current under the pads to be large, pad area is preferably chosen to significantly exceed the area between pads. Alternatively, as shown in FIG. 3, layer portions of some or all of layers 3 to 10 of FIG. 1 may be etched away between contacts, leaving, e.g., resonant-tunneling diode structures 31 mutually isolated as may be advantageous in the interest of minimization of background current. Furthermore, etching after layer deposition may be used to produce, on one and the same substrate, a plurality of devices in accordance with FIG. 1.

Figure 4:
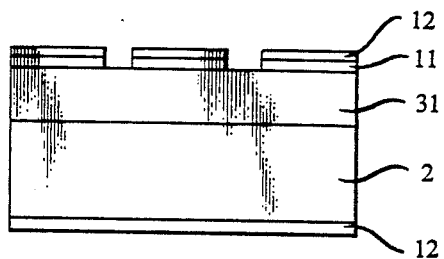
FIG. 4 is a schematic cross-sectional representation of a third preferred embodiment of a device in apparatus of the invention.

As a further variant form of the device, depicted in FIG. 4, one or several additional contact pads may be provided between pads A and B of FIG. 1, and it is apparent that such provision is functionally equivalent to the presence in FIG. 2 of more than two resonant-tunneling diodes in parallel. In this case, the resistance of portions of layer 8 extending between contact pads conveniently provides for voltage division, thereby obviating the need for additional voltage sources. (In the interest of approximately constant voltage division, design of the structure preferably provides for sufficiently large current in the divider network as compared with current through the resonant-tunneling diodes.)

Further with reference to FIG. 1, device operation equivalent to side-by-side resonant-tunneling diodes can be realized also in the absence of heterojunction 19, in which case an offset layer may be used replacing heterojunction 19; for example, a 5-nanometer layer of undoped gallium arsenide is suitable for this purpose.

While it is possible to implement the circuit of FIG. 2 using discrete tunnel diodes 21 and 22, a monolithically integrated device has distinct advantages in that, e.g., parasitic resistances and capacitances are reduced, and in that the reproducibility of current-voltage characteristics is enhanced due to uniformity of doping levels in the two or more resonant-tunneling diodes made on a common substrate in the course of one and the same manufacturing process.

For different values of the potential difference $V_{BA}$ between terminals B and A of FIG. 1, current through substrate terminal S of a device as described above was measured as a function of a positive bias applied between terminal S and grounded terminal A; this current is essentially the sum of the two resonant-tunneling currents flowing through the two resonant-tunneling diodes. As is apparent upon inspection of the corresponding graphs (FIG. 5 and FIG. 6), for zero potential difference $V_{BA}$ there is a single current peak, negative conductance being due to quenching of resonant tunneling through the double barriers under terminals A and B. When terminal B is biased negatively with respect to terminal A (FIG. 5), an additional current peak develops at lower voltages; the position of one peak remains unchanged while that of the other moves to lower bias as the potential difference $V_{BA}$ between B and A is made more negative. By appropriate choice of the bias between B and A the two peak currents can be made nearly equal.

An explanation of this effect may be provided as follows: As a result of the bias applied between A and B, the potential differences across the two double barriers are different, and for B negatively biased with respect to A, resonant tunneling through the double barrier under terminal B is quenched at a lower substrate bias than in the double barrier under terminal A, leading to two peaks in the current-voltage diagram. The peak that does not shift with varying $V_{BA}$ is associated with quenching of resonant tunneling through the diode under terminal A. As expected, the separation between the peaks is nearly equal to the bias applied between A and B.

Finally, if terminal B is positively biased with respect to terminal A (FIG. 6), a higher voltage is required to quench resonant tunneling through the double barrier under terminal B, leading to a second peak which shifts to higher voltages as $V_{BA}$ is increased. Similar results are obtained with negative bias applied to terminal S.

Figure 5:
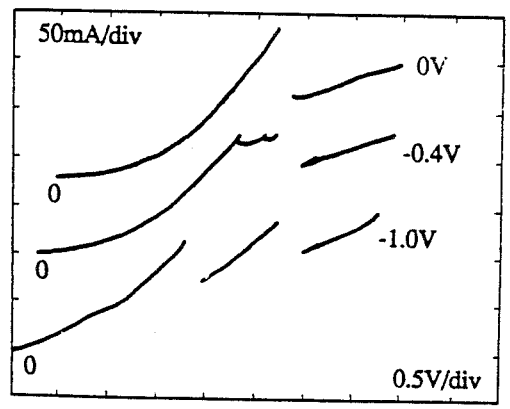
FIG. 5 and 6 are photographically recorded current-voltage diagrams as obtained by operating a device as shown in FIG. 1.
Figure 6:
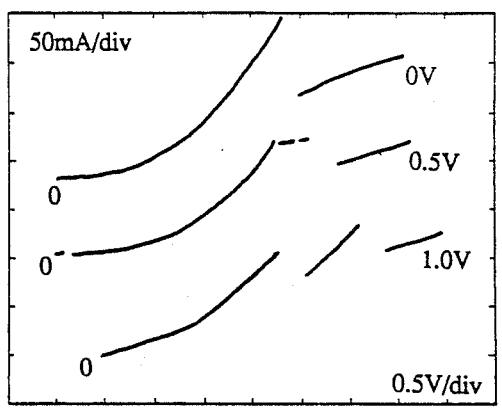

While the characteristics of FIG. 5 and 6 were obtained for an operating temperature of 100 K., suitable processing and material choices are expected to permit room-temperature device operation as have been realized in resonant-tunneling diodes and transistors.

Figure 7:
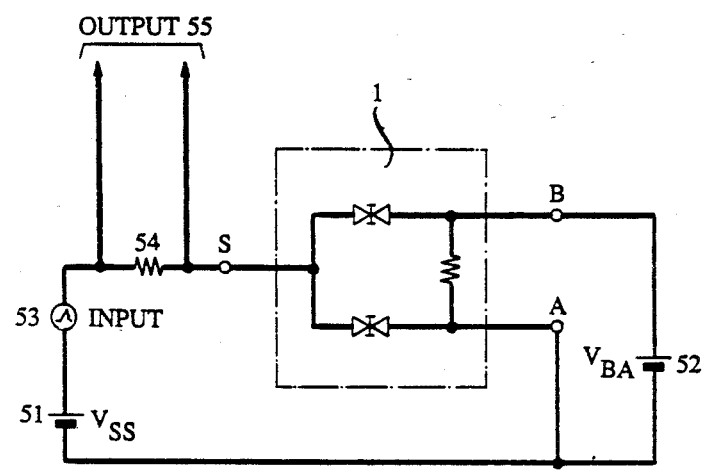
FIG. 7 is a diagram of first apparatus or circuit including a device in accordance with the invention.
Figure 8:
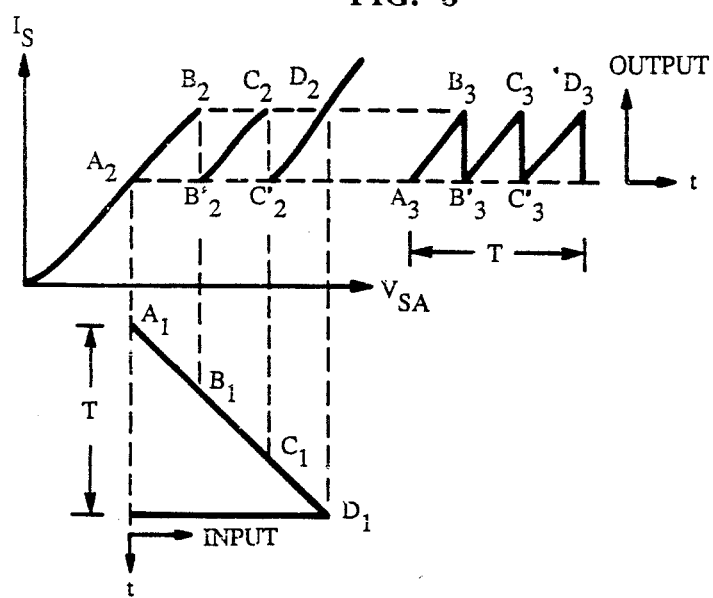
FIG. 8 and 9 are schematic current-voltage diagrams corresponding to operation of a circuit in accordance with FIG. 7, such circuit serving as a frequency multiplier.
Figure 9:
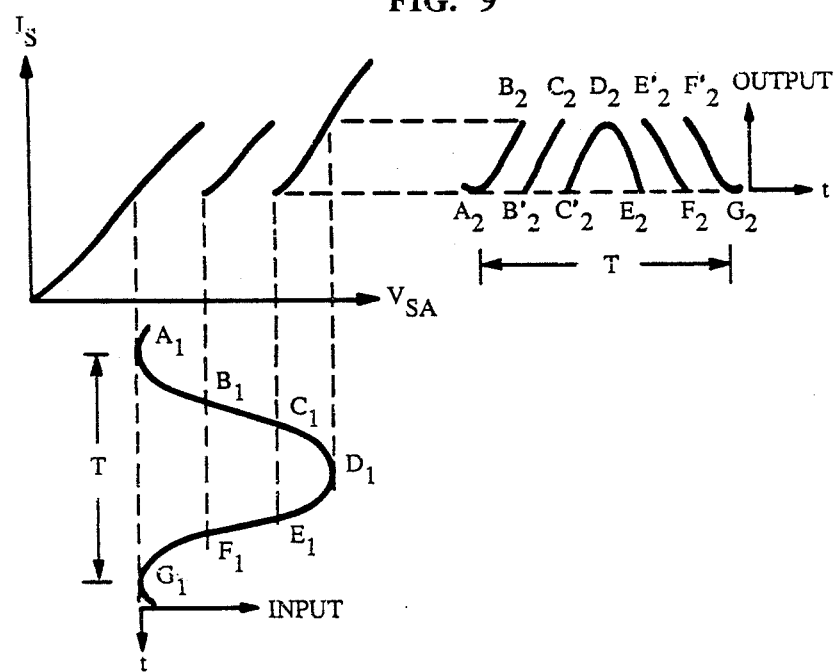

The device of FIG. 1 can be used in suitably designed circuitry for a variety of functions; one circuit, designed for frequency multiplication, is shown in FIG. 7 with associated current-voltage diagrams of FIG. 8 and FIG. 9, bias voltage $V_{BA}$ between terminal A and B of the device being fixed.

FIG. 7 shows device 1 with terminals A, B, and S in accordance with FIG. 1, source 51 of substrate bias voltaage $V_{SS}$, source 52 of bias voltage $V_{BA}$, input signal source 53, resistor 54, and output terminals 55.

FIG. 8 shows device characteristics in the case of a sawtooth input voltage, substrate bias voltage $V_{SS}$ having been adjusted to select the quiescent operating point $A_2$. As the sawtooth input voltage increases from $A_1$ to $B_1$, the operating point shifts from $A_2$ to $B_2$ along the characteristic, with the substrate current $I_s$ increasing approximately linearly. The output voltage across the resistance R is proportional to the source current $I_s$, and thus its increase from $A_3$ to $B_3$ is also approximately linear. As the input voltage increases beyond $B_1$, the source current $I_s$ suddenly drops to the valley point $B_2'$, resulting in a sudden drop in the output voltage from $B_3$ to $B_3'$. Between $B_3$ and $C_3$, the output continues to rise again, followed by a second drop at $C_2$, and then a rise as the input continues to rise up to $D_1$. At $D_1$, the input returns to zero to start a new cycle, and the operating point also shifts back to $A_2$, with a drop in the output as well. Accordingly, the frequency of the sawtooth input signal has been multiplied by a factor of 3. (If $V_{BA}$ had been adjusted to produce a single peak in the current-voltage diagram, sawtooth frequency would have been multiplied by a factor of two.)

FIG. 9 illustrates device operation in case of a sine-wave input and is amenable to detailed description analogous to description in the case of FIG. 8 above. The output waveform is found to be rich in the fifth harmonic of the input. (If $V_{BA}$ had been adjusted to produce a single peak in the current-voltage diagram, the output would have been rich in the third harmonic.)

Experimental results obtained with $V_{BA}=1$ V and $V_{SS}=2.3$ V in the circuit of FIG. 7 showed superior efficiency in frequency multiplication and in generating fifth harmonic as compared with conventional devices such as, e.g., a step recovery diode.

Figure 10:
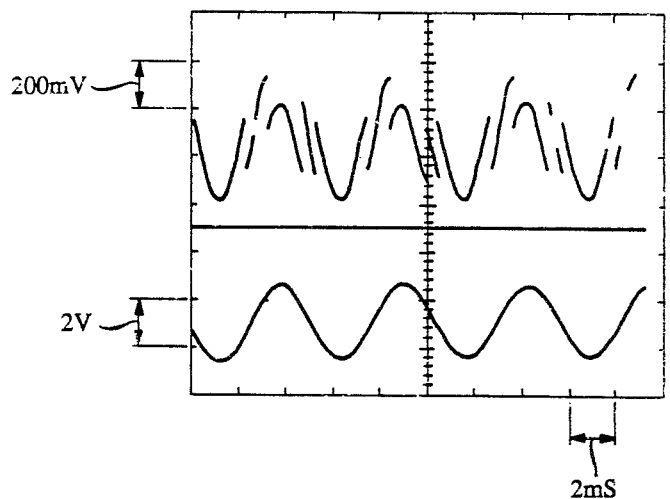
FIG. 10 is a photographically recorded current-voltage diagram corresponding to operation of the circuit shown in FIG. 7, operating conditions being chosen for waveform scrambling.

FIG. 10 shows output of a circuit of FIG. 7 used for waveform scrambling in the case of a sine-wave input signal. Scrambling is effected by choosing a bias $V_{BA}$ such that the two current peaks are of different height (here, specifically, $V_{BA}=1.4$ V) in which case the input waveform is broken up at arbitrary phases, and the different segments are amplified differently at the output, The original waveform can be recovered from the scrambled signal by using an identical device in the feedback circuit of an amplifier, biased to the same voltages as in the scrambling circuit.

Figure 12:
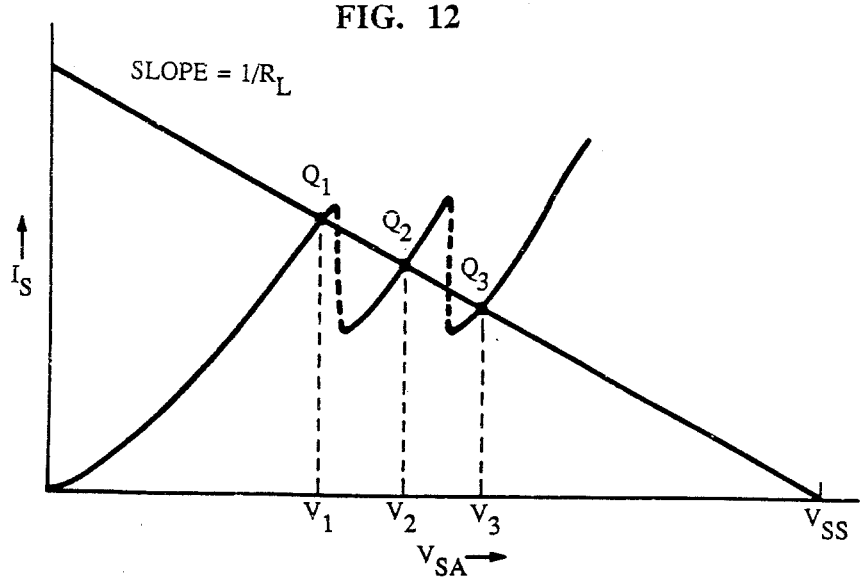
FIG. 12 is a schematic current-voltage diagram corresponding to operation of the circuit shown in FIG. 11, such circuit serving as a three-state memory element.
Figure 11:
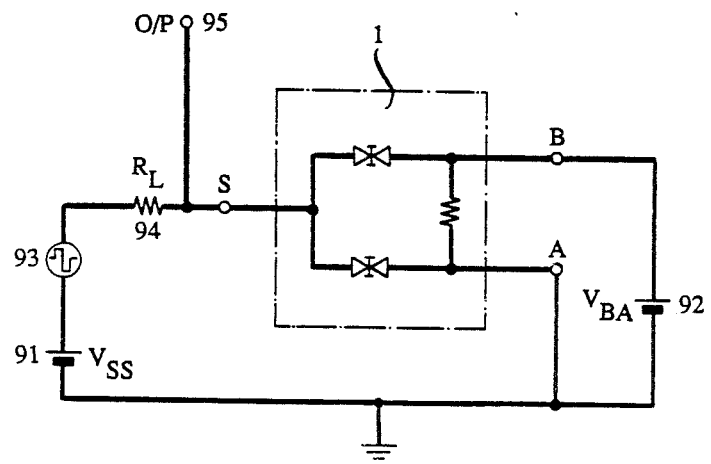
FIG. 11 is a diagram of second apparatus or circuit including a device in accordance with the invention.

FIG. 11 shows a circuit which can serve as a memory element in a 3-state logic system. Shown are source 91 of supply voltage $V_{SS}$, source 92 of bias voltage $V_{BA}$, input signal source 93, resistor 94, and output terminal 95. As illustrated in FIG. 12, the bias voltage $V_{BA}$ between the terminals A and B is adjusted to produce a current-voltage characteristic having essentially equal peaks at the same current level. And, for a suitable supply voltage $V_{SS}$, and load resistance $R_L$, the load line intersects the current-voltage characteristic at five different points of which three ($Q_1$, $Q_2$, and $Q_3$) are in the positive slope parts of the curve and hence correspond to stable operating points. Corresponding to these stable operating points there are respective output voltages $V_1$, $V_2$, and $V_3$, and the circuit can stay indefinitely at any one of these points, thus retaining the last voltage information supplied. Thus, the device can be used as a memory element having three stable states, with voltages $V_1$, $V_2$, and $V_3$ representing three logic values. (As compared with existing three-state logic circuits requiring 4 conventional transistors and 6 resistors, this represents a significantly simpler alternative.) The circuit can be switched from one state to another by applying a short voltage pulse.

In an experiment, switching between states was effected by momentarily changing the supply voltage $V_{SS}$ which is equivalent to applying a short voltage pulse. With a supply voltage $V_{SS}=16$ V, a load resistance $R_L=215$ ohms, and a bias voltage $V_{BA}=0.7$ V, the three stable states were found to be at 3.0 V, 3.6 V, and 4.3 V. The corresponding load line as drawn on the measured current-voltage characteristics of the device intersects, respectively, at 2.8 V, 3.4 V, and 4.1 V, in close agreement with the measured values of the operating points.

Figure 13:
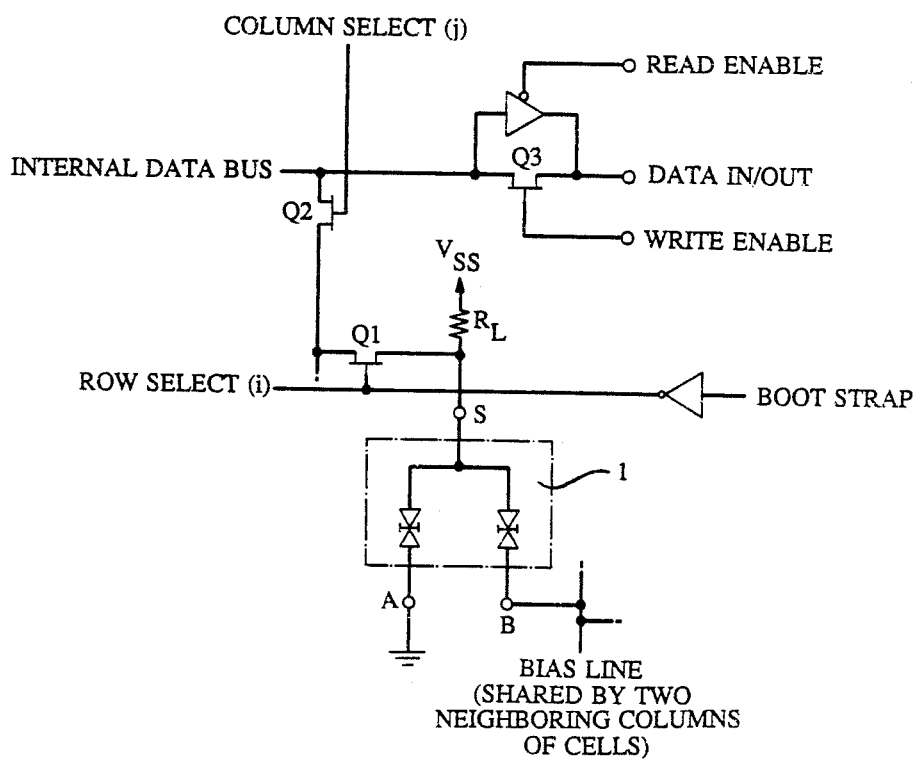
FIG. 13 is a diagram of a typical integrated circuit layout using a three-state memory element in accordance with the invention.

The three-state memory cell as discussed above in connection with FIG. 11 and FIG. 12 is well-suited for integration in memory integrated circuits with read-write and encoding capabilities as shown in FIG. 13. The memory cells are interconnected as a matrix array, and a particular element in the array is addressed by activating the corresponding row- and column-select lines. A row-select connects each device in a specified row to the corresponding column line, and the column-select connects the selected column to the data bus. For example, in the case of the (i, j)-element shown in FIG. 13, when the i-th row-select line is activated, the driving switch Q1 is turned on, as well as the switches for every element in the i-th row. The column-select logic now connects the j-th column to the data bus. The ternary identity cell T (described in detail, e.g., by A. Heung et al., "An all-CMOS Ternary Identity Cell for VLSI Implementation", *Electronics Letters*, Vol. 20 (1984), pp. 221–222) acts as buffer between the memory element and the external circuit. For reading data from the memory, the identity cell is activated with the read-enable line, and data from the (i,j)-th element is transferred via the data bus to the I/O pin of the circuit. When the write-enable line is activated, data from an external circuit is connected to the data bus and written on the (i,j)-th element.

Figure 14:
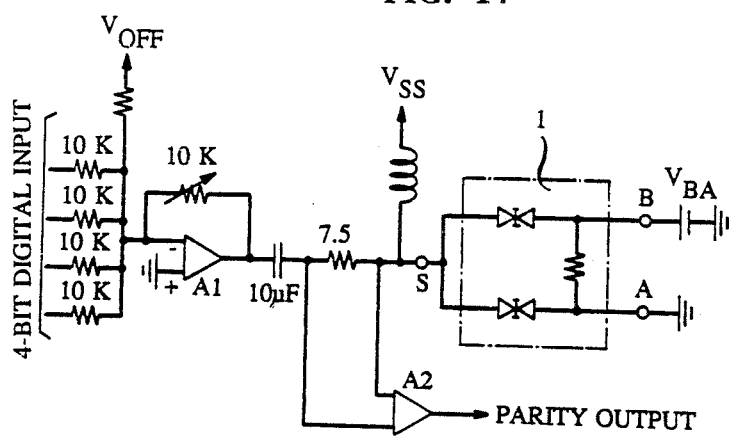
FIG. 14 is a diagram of third apparatus or circuit including a device in accordance with the invention.
Figure 15:
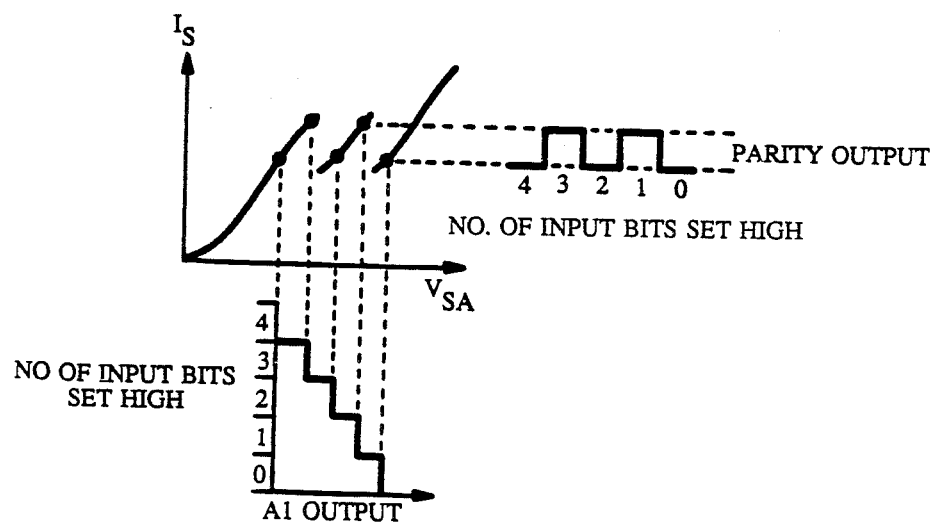
FIG. 15 is a schematic current-voltage diagram corresponding to operation of the circuit shown in FIG. 14, such circuit serving as a parity-bit generator.

FIG. 14 shows a circuit which can operate as a 4-bit parity generator, appreciation of corresponding device operation being facilitated by reference to FIG. 15 which shows the current-voltage characteristic of the device. The four digital input signals are added in the inverting summing amplifier $A_1$ to produce five distinct voltage steps at its output, corresponding to the number of digital bits in the high state. Normally, the output of $A_1$ would be negative for positive input voltages. The addition of a suitable negative offset voltage $V_{OFF}$ at the input results in up-shifting of the waveform to produce the output for $A_1$ shown in the bottom part of FIG. 15. The substrate bias voltage $V_{SS}$ is adjusted to select the operating points of the device at the five points emphasized by dots in the currentvoltage characteristic, corresponding, respectively, to the five voltage levels at the $A_1$ output. The substrate current of the device generates a voltage across the 7.5-ohm resistor, which is picked up by the buffer amplifier $A_2$. The circuit operates as a 4-bit parity generator in that its output is high when the number of input bits set high is odd, and low otherwise. As compared with a conventional circuit using 3 exclusive-OR gates, each requiring 8 transistors, considerable reduction in the number of circuit components is realized in the circuit of FIG. 14.

Figure 16:
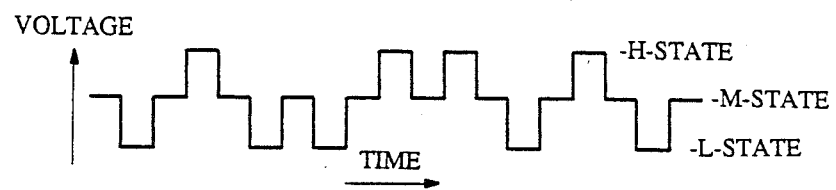
FIG. 16 is a diagram of voltage levels representing binary signals in pseudo-ternary form as used in coaxial telephone systems.

While implementation of circuits of FIG. 7, 11, 13, and 14 preferably involves the use of highly miniaturized resonant-tunneling devices, relatively large-scale devices having dimensions as described with respect to FIG. 1 are of immediate interest on account of low internal impedance of approximately 10 ohms, and further on account of compatibility with bipolar threshold detectors due to voltage steps of approximately 0.6 to 0.7 volts. In view of such impedance and voltage characteristics, a device as described can be used as a driver of the pseudoternary signal used in a coaxial-cable telephone transmission; see FIG. 16 for a typical such signal stream as designed for easy extraction of the clock signal.

Figure 17:
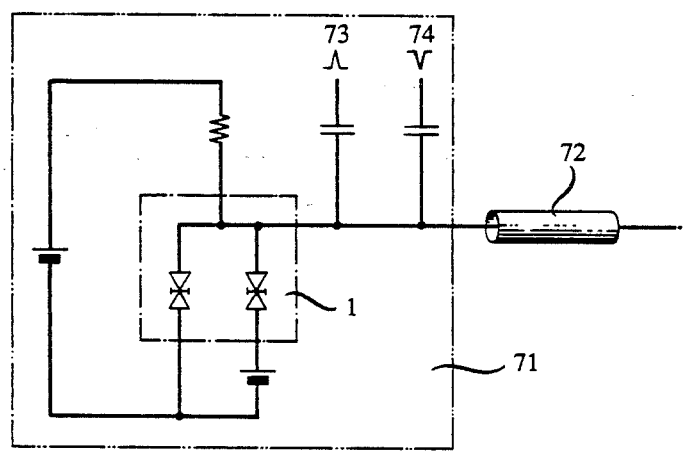
FIG. 17 is a diagram of fourth apparatus or circuit including a device in accordance with the invention, adapted for coaxial line driving.

FIG. 17 diagrammatically shows pseudo-ternary driver 71 for coaxial cable 72; driver 71 includes device 1 in accordance with FIG. 1. Preferably, internal impedance of driver 71, as observed from cable 72, is less than approximately one-tenth of the characteristic impedance of cable 72, the latter typically being in the range from 50 to 75 ohms. Normally, the driver is at the middle state (M-state). If an up-going pulse 73 is applied, the driver undergoes transition to the high state (H-state), and if then a down-going pulse 74 is applied, the driver returns to the middle state. With the driver at middle state, if a down-going pulse 74 is applied, the driver switches to the low state (L-state).

Among advantages of a driver as described are fast switching speed and small current spike as there is no overlapped drive due to signal skew.

What is claimed is:

1. Apparatus comprising a semiconductor device which comprises first (A), second (S), and third (B) terminals, said device being capable of operating such that the current-voltage characteristic between said first terminal and said second terminal comprises a plurality of voltage ranges in which differential resistance is negative, characterized in that said device comprises a substrate-supported resonant-tunneling structure consisting of a quantum-well layer between first and second barrier layers, said first and third terminals being on the side of said first barrier layer, and said second terminal being on the side of said second barrier layer, and said resonant-tunneling structure being the only resonant-tunneling structure between said first and third terminals on the one side and said second terminal on the other side.

2. Apparatus of claim 1, the material of said quantum-well layer having a bandgap which is less than the bandgap of the material of said barrier layers.

3. Apparatus of claim 1, said device further comprising a heterojunction layer structure between said first barrier layer and said first-and-third terminals.

4. Apparatus of claim 3, said heterojunction layer structure comprising an essentially undoped semiconductor channel layer between said first barrier layer and said firstand-third terminals.

5. Apparatus of claim 4, said heterojunction layer structure comprising a doped-semiconductor donor layer between said channel layer and said first-and-third terminals, said donor layer having a composition which is different from the composition of said channel layer.

6. Apparatus of claim 5, said heterojunction layer structure further comprising an essentially undoped semiconductor spacer layer between said donor layer and said channel layer, said spacer layer having a composition which is essentially the same as the composition of said donor layer.

7. Apparatus of claim 1, said first and third terminals being the only terminals on the side of said first barrier layer, and the gap between said first and third terminal being etched.

8. Apparatus of claim 7, etching being to the substrate.

9. Apparatus of claim 5, said device futher comprising at least one additional terminal between said first and third terminals.

10. Apparatus of claim 9, gaps between terminals on the side of said first barrier layer being etched to said donor layer.

11. Apparatus of claim 9, said channel layer providing for voltage division such that the sum of voltages between successive pairs of terminals on the side of said first barrier layer is essentially equal to the voltage between said first and third terminals.

12. Apparatus of claim 1, areas of contacts on the side of said first barrier layer being essentially equal.

13. Apparatus of claim 1, areas of contacts on the side of said first barrier layer being significantly greater than areas of gaps between such contacts.

14. Apparatus of claim 1, the material of said quantum-well layer consisting essentially of gallium arsenide, and the material of said barrier layers consisting essentially of aluminum arsenide.

15. Apparatus of claim 1, said device being biased such that peak currents in said voltage ranges are approximately equal.

16. Apparatus of claim 1, further comprising circuitry connected to said device whereby said apparatus performs frequency multiplication.

17. Apparatus of claim 1, further comprising circuitry connected to said device whereby said apparatus performs waveform scrambling.

18. Apparatus of claim 1, further comprising circuitry connected to said device whereby said apparatus performs memory operation.

19. Apparatus of claim 1, further comprising circuitry connected to said device whereby said apparatus performs parity-bit generation.

20. Apparatus of claim 1, further comprising circuitry connected to said device whereby said apparatus performs coaxial-cable signal generation.

* * * * *